United States Patent [19]
Suzuki et al.

[11] Patent Number: 5,452,509
[45] Date of Patent: Sep. 26, 1995

[54] SURFACE MOUNTER

[75] Inventors: Katsuhiko Suzuki; Takeshi Tamiwa; Yoshihisa Iwatsuka, all of Iwata, Japan

[73] Assignee: Yamaha Hatsudoki Kabushiki Kaisha, Iwata, Japan

[21] Appl. No.: 7,063

[22] Filed: Jan. 21, 1993

[30] Foreign Application Priority Data

Jan. 21, 1992 [JP] Japan ................................... 4-029083
Jan. 21, 1992 [JP] Japan ................................... 4-029084

[51] Int. Cl.$^6$ ............................. H05K 3/30; B23P 19/04
[52] U.S. Cl. ........................... 29/740; 29/743; 29/759; 29/794
[58] Field of Search .......................... 29/740, 741, 742, 29/743, 759, 809, 794, 783, 834, 786, 793; 414/223, 225; 198/803.01, 803.5

[56] References Cited

U.S. PATENT DOCUMENTS

| | | | |
|---|---|---|---|
| 4,694,570 | 9/1987 | Rudolph et al. ..................... | 29/759 X |
| 4,731,923 | 3/1988 | Yagi et al. ............................. | 29/834 X |
| 4,908,092 | 3/1990 | Koibuchi ............................... | 29/743 X |
| 4,934,891 | 6/1990 | Hawkswell ............................ | 29/809 X |
| 5,088,187 | 2/1992 | Takata et al. ......................... | 29/740 X |
| 5,145,047 | 9/1992 | Terracol et al. ...................... | 29/794 X |

*Primary Examiner*—Peter Vo
*Attorney, Agent, or Firm*—Knobbe, Martens, Olson & Bear

[57] ABSTRACT

A service mounter having a conveyor along which substrates are moved in an X direction. A plurality of mounters are mounted for movement in the X direction on opposite sides of the conveyor and pick up work pieces from feeders disposed on the sides of the conveyor. Operating sections are supported for movement on opposite sides of the conveyor along a Y axis and are adapted to receive substrates from the conveyor and position them relative to the mounters to receive the work pieces. An improved mounter construction is also disclosed that includes a servomotor to adjust the height to accommodate for variations in thickness and the various components manipulated.

19 Claims, 11 Drawing Sheets

5,452,509

1

SURFACE MOUNTER

BACKGROUND OF THE INVENTION

This invention relates to a surface mounter and more particularly to an improved mechanism for placing articles on a work piece.

A wide variety of devices have been proposed for picking a work piece from a supply station and placing it at a desired location at a work station. For example, there are provided a number of various devices called "surface mounters" which will pick discreet and minute electrical components such as integrated circuits, resistors, condensers or the like and mounting them on a surface of a substrate such as a printed circuit board.

Generally the way these devices operate is that the substrate or circuit board is moved along a conveyor to a specific work station. A gripping device, which normally operates by vacuum, will pick up the electrical component from a feeder and move in the X and Y axes to locate the component above the desired location on the substrate and then deposit it on the substrate. The way these devices are normally constructed is that there is a first frame or carriage that is supported for movement in the X-X direction and a second carriage that is supported on the first carriage and moveable relative to it in the Y-Y direction. By moving the two carriages either together and/or relative to each other, the desired X-Y location for pick-up and deposit can be determined. However, this type of device is rather cumbersome and because of the dual carriage arrangement its speed tends to be slow and the number of devices which can be utilized to function at a single work station are limited.

Various devices have been proposed for attempting to solve these problems and one such device is shown schematically in FIG. 1, which figure comprises a top plan view of this type of device and which is illustrated primarily in schematic form. In this device, a mounter 21 is supported for movement along an X-X axis by means of a guide rail 22. The mounter 21 is adapted to pick up work pieces from selective feeding stations 23 and/or 24 and deposit them on a substrate P, such as a printed circuit board, which is mounted for movement along a Y-Y axis on a support shaft 25. As may be seen from this figure, if the number of feeder stations is to be increased or the size of the feeder stations increased, this must be done in the X-X plane and thus there is further delay in having the feeder move to the station where the substrate P is located. Another type of prior art device is shown in FIG. 2, which also comprises a top plan view similar to FIG. 1, and includes a feeder 23 on which components are moved for depositing on the substrate P by a rotary mounting head 31. The substrate P are moved in the X-Y direction by suitable support rails. The disadvantage with this type of construction is that it is quite large and the mechanism becomes complicated for coping with multi-production.

It is, therefore, a principal object of this invention to provide an improved high speed surface mounter.

It is a further object of this invention to provide a high speed surface mounter that permits rapid movement and accurate placement of a plurality of different types of work pieces at different locations on a plurality of different types of substrates.

As has been noted, the components to be mounted are picked up by a pick-up device, normally one which is vacuum operated. It is the conventional practice to mount

2 these pick-up devices on a pneumatic cylinder which moves from a position wherein the work piece is picked up to a retracted position and then back to a position for mounting the components on the substrate. The disadvantage with this type of construction is that the pneumatic cylinder which moves the head has generally fixed stroke and its speed during movement cannot be controlled. As a result, when there are variations in the height of the various components, such as the location of the substrate, the components may be mounted on the substrate with shock. In addition, the versatility of the system is limited.

Therefore, it is a further object of this invention to provide an improved mounter arrangement for selectively gripping the components and which has versatility in its movement.

SUMMARY OF THE INVENTION

A first feature of this invention is adapted to be embodied in a device for mounting components on a substrate conveyed along a conveyor line. A mounter is mounted for movement along a first axis and includes means for gripping and releasing the components. An operating section is mounted for movement along a second axis that is disposed at an angle to the first axis and which is adapted to receive substrates from the conveying line and positioning the substrates relative to the mounter.

Another feature of the invention is adapted to be embodied in a mounter for selectively gripping and releasing work pieces that comprises a base and a gripper for selectively gripping and releasing work pieces, Means are provided for moving the gripper relative to the base and a servomotor is incorporated for positioning the means for moving the gripper in selected positions relative to the base.

DETAILED DESCRIPTION OF THE PREFERRED EMBODIMENTS OF THE INVENTION

Figure 3:
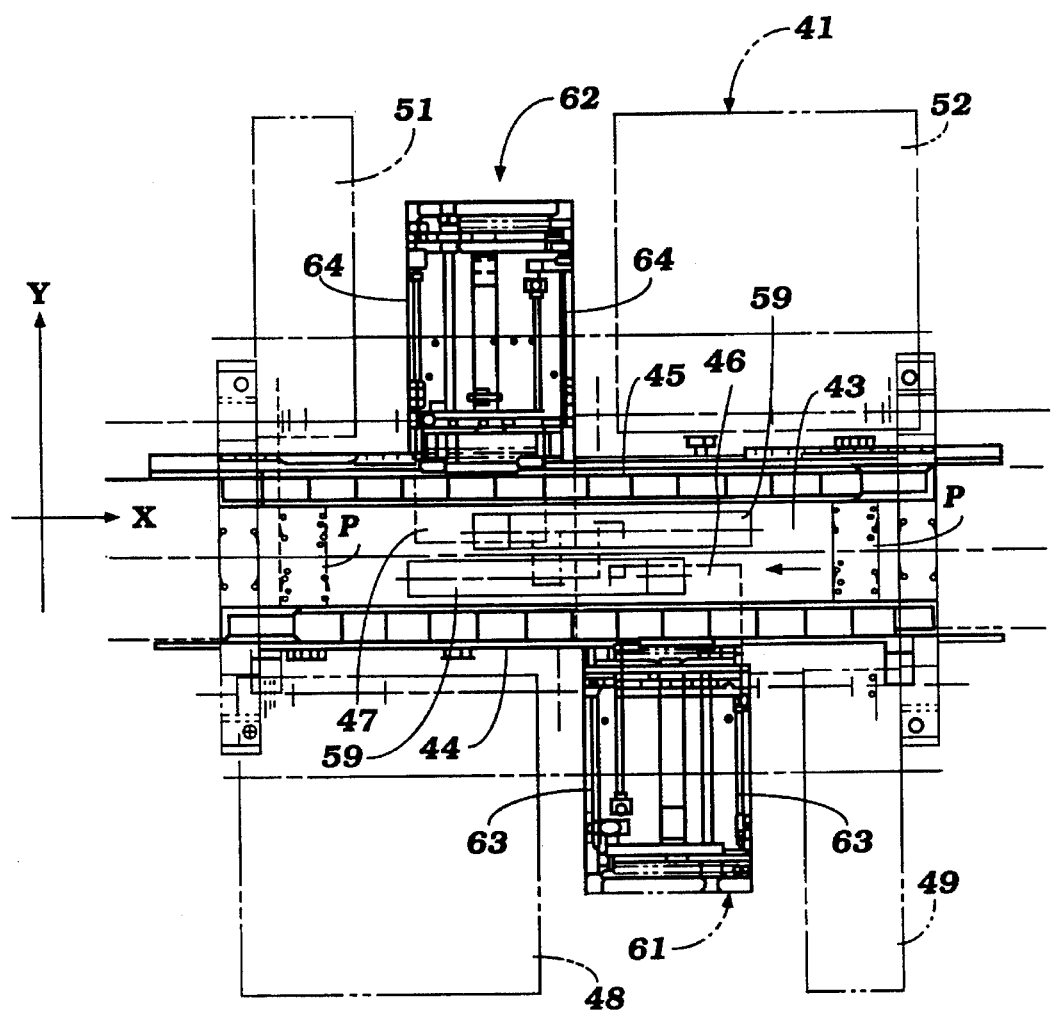
FIG. 3 is a top plan view of a surface mounter constructed in accordance with an embodiment of the invention.
Figure 4:
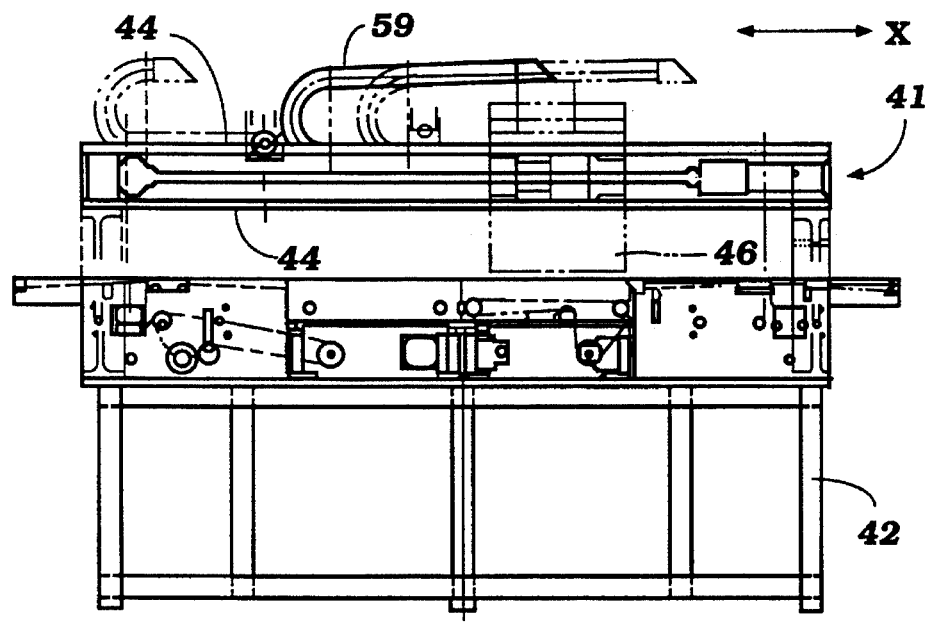
FIG. 4 is a front view of the surface mounter.
Figure 5:
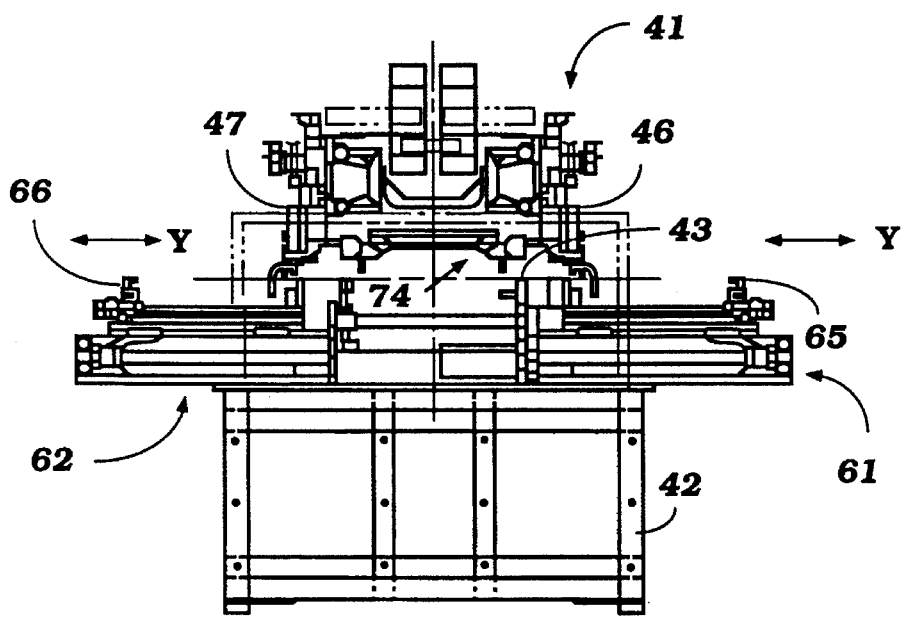
FIG. 5 is side view of the surface mounter.

Referring first to FIGS. 3 through 5, a surface mounter constructed in accordance with an embodiment of the invention is identified generally by the reference numeral 41. The surface mounter 41 is comprised of a base 42 on which is mounted a conveyor 43 that carries substrates P and which are moved along the conveyor 43 in a direction generally along X-X axis.

Pairs of parallel rails 44 and 45, respectively, are mounted on opposite sides of the conveyor 43 and also extend in the X-X axis. Mounter heads 46 and 47 are mounted on the rails 44 and 45, respectively, in a manner to be described and are adapted to selectively pick components from respective pairs of feeder stations 48 and 49 and 51 and 52 positioned on opposite side of the conveyor 43. These mounter heads 46 and 47 are adapted to be brought into registry with the respective feeder stations 48, 49 and 51, 52 to pick up components presented therein and to move them in the X-X direction.

Figure 6:
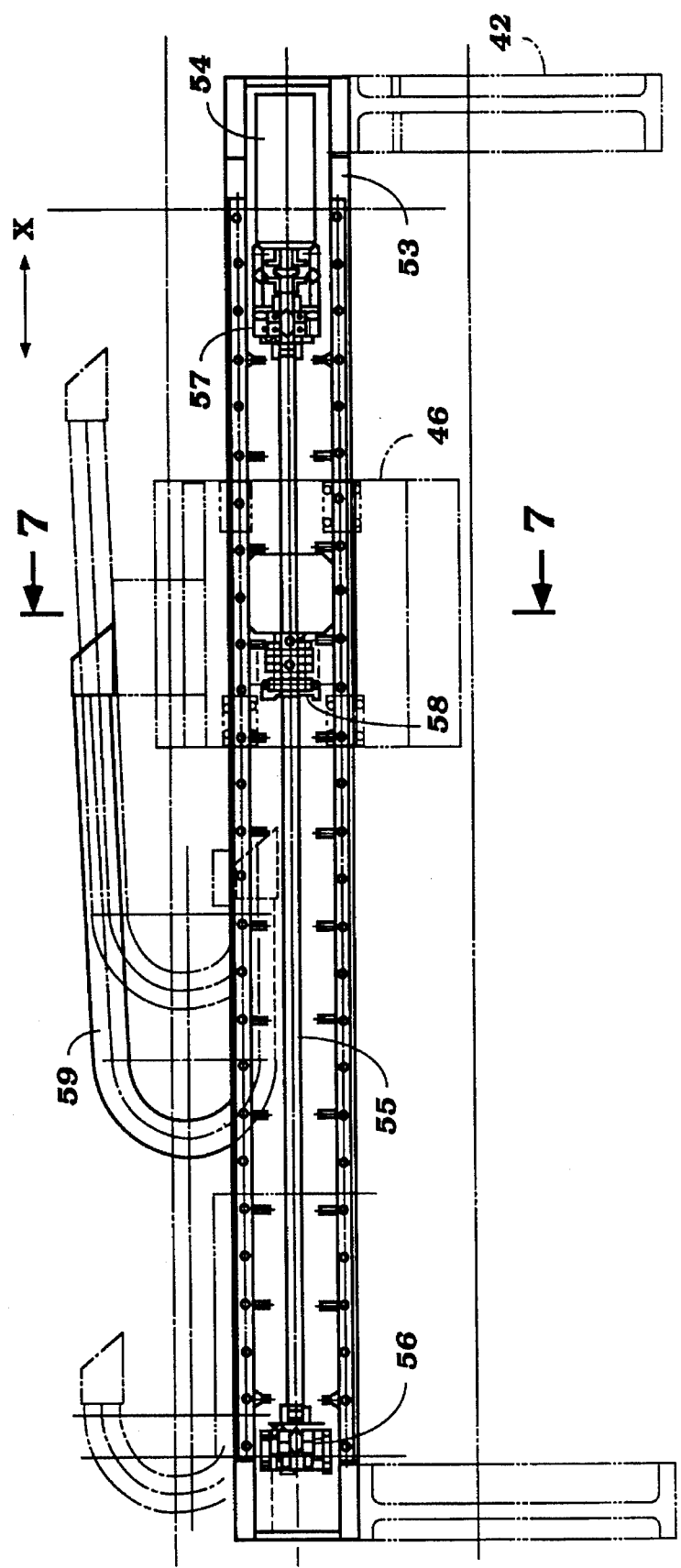
FIG. 6 is an enlarged front view of a portion of the surface mounter.
Figure 7:
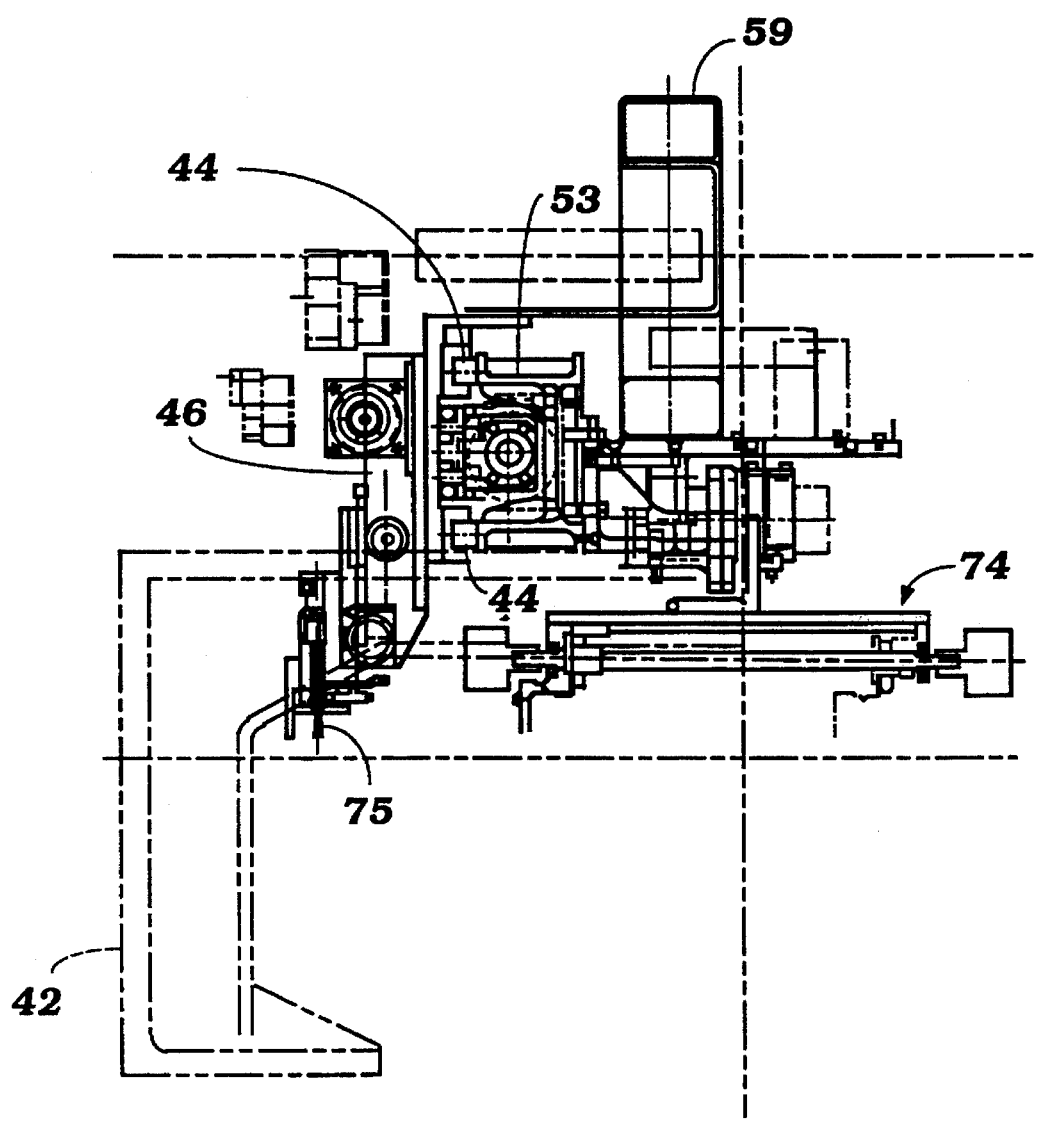
FIG. 7 is an enlarged view of the surface mounter taken in the direction of the line 7—7 in FIG. 6.

FIGS. 6 and 7 illustrate how the movement of the mounter heads 46 and 47 is accomplished at each side of the conveyor 43 with the figures showing the construction associated with the mounter head 46. It is to be understood that an identical structure is employed with the mounter head 47.

As may be seen, the guide rails 44 are carried by a linear guide 53 which is mounted on the base 42 at the respective side of the conveyor 43. A servomotor 54, such as a reversible electric motor, is mounted at one end of the guide 53 and drives a ball screw shaft 55 which is supported in bearings 56 and 57 disposed at the ends of the screw shaft 55. A ball nut 58 is affixed to the mounter head 46 in a suitable manner and as the shaft 55 is rotated, the mounter head 46 will be moved in the X-X direction.

A flexible guide and duct 59 is connected to the mounter head 46 for supplying vacuum and electrical controls to it and this guide 59 will accommodate the movement of the mounter head 46 relative to the base 42. Hence, it should be readily apparent that the mounter heads 46 and 47 can be rapidly moved only in the X-X direction relative to the conveyor 43 and the operating sections, now to be described by reference again to FIGS. 3 through 5.

Like the mounter heads 46 and 47, there is provided a pair of operating sections 61 and 62 each positioned at a respective side of the conveyor 43. The operating stations 61 and 62 are each mounted on respective pairs of rods 63 or 64 which extend at an angle to the axis of the guide rails 44 and 45, respectively. In the illustrated embodiment, this angle is a right angle so that the support rods 63 and 64 extend along the Y-Y axis. Each operating station 61 and 62 is moveable from a position outside of the shafts 44 and 45 to a position over the conveyor 43 so as to selectively remove a substrate P from the conveyor 43 and position it in the desired Y-Y location. Holding devices, indicated by the reference numerals 65 and 66 (FIG. 4) are mounted on the station 61 and 62, respectively for this purpose. This construction will now be described by particular reference to FIGS. 8 and 9.

Figure 8:
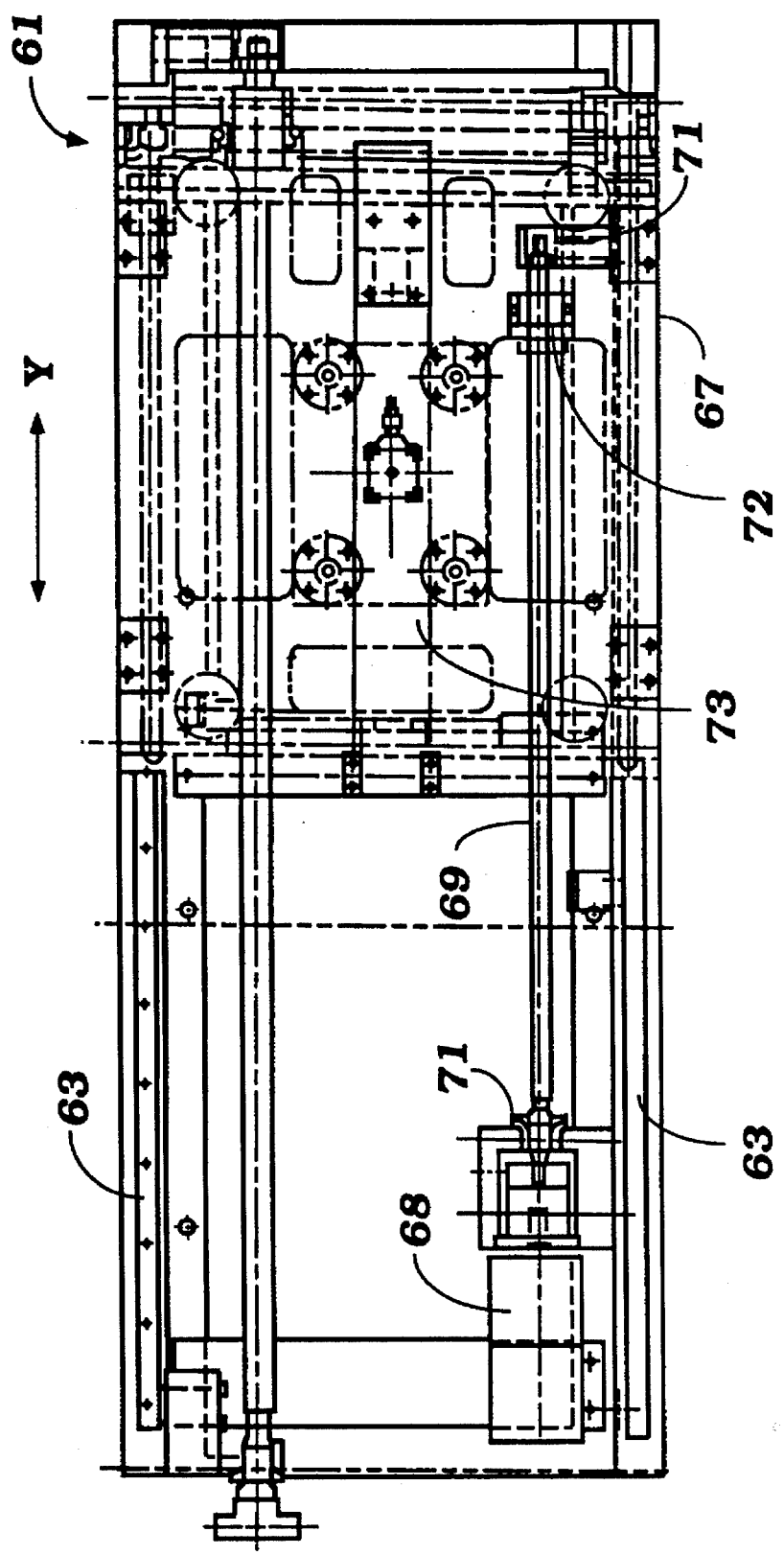
FIG. 8 is a plan view of the operating section.
Figure 9:
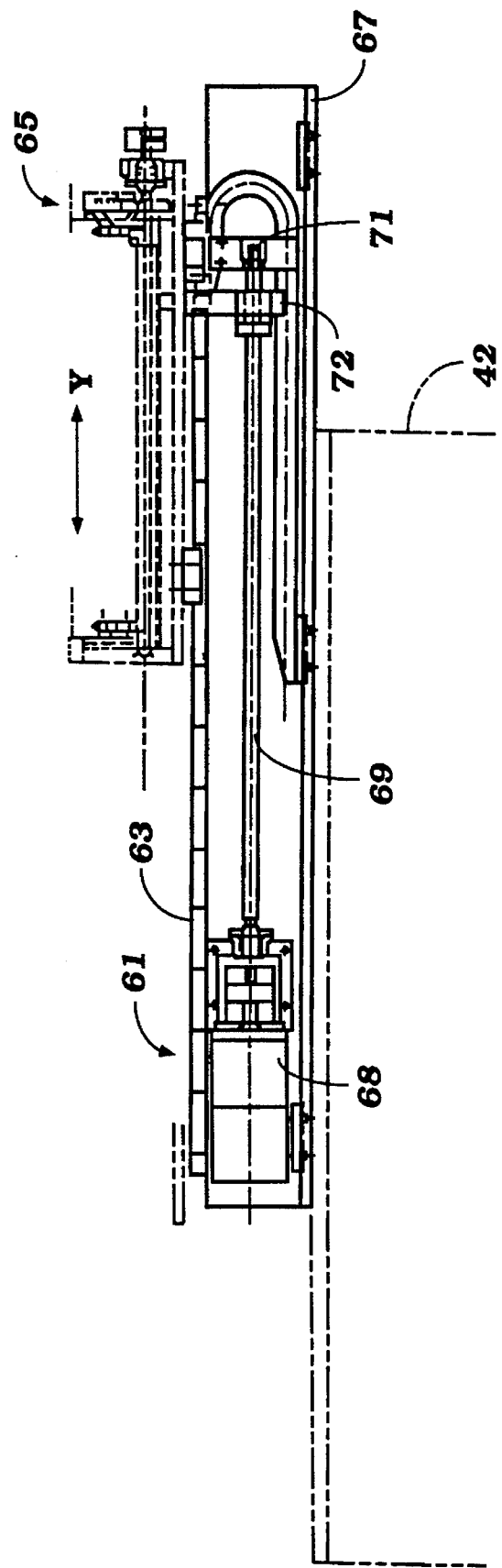
FIG. 9 is side view of the operating section.

Only one of the operating stations is shown in FIGS. 8 and 9, this being the station 61. It should be readily apparent to those skilled in the art how the section 62 is constructed and arranged. The station 61 is provided with a base 67 that is fixed relative to the base 42 of the mounter assembly 41 in an appropriate manner. The pair of guide rails 63 are mounted appropriately on the base 67 and extend, as noted above, perpendicularly to the shafts 44 and 45. A servomotor, 68 in the form of a reversible electric motor is mounted on the base 67 and drives a ball screw shaft 69 that is journaled in appropriate bearings 71 disposed at opposite ends of the shaft 69. The holding device 65 is provided with a recirculating ball nut 72 that is in engagement with the screw shaft 69 so that the holding device 65 will be moved longitudinally in the Y-Y direction along the guide rail 63 upon rotation of the servomotor 68 and screw shaft 69 in the desired direction. Flexible ducts 73 are connected at one end to the holding device 65 and supply electrical power and other connections to the holding device 65.

A substrate transfer device 74 (FIGS. 5 and 7) is provided in proximity to the conveyor 43 and functions to remove a substrate P from the conveyor 43 and transfer it to the respective holding device 65 or 66 of the operating station 61 or 62.

The device operates in the following manner. As the conveyor 43 operates and presents substrates P they reach a sensing device on the respective side of the operating station 61 or 62 and the conveyor 43 is stopped. The transfer device 74 then transfers the substrate to the respective holding device 65 or 66 carried by the respective operating station 61 or 62. The operating station 61 or 62 is then moved to the specific operating position in the Y-Y direction where it will register with the mounter heads 46 or 47 which are moved in the X-X direction in the manner as previously noted. Each mounter head 46 and 47 carries a plurality of mounters 75 (FIG. 7) which may comprise sixteen (16) in a preferred embodiment of the invention which will have picked up appropriate components from the feeders 48, 49 or 51, 52. In this way, a plurality of components may be mounted at a single time on a substrate carried on the operating section 61.

After the mounting operation is completed in the operating section 61, the operating section 61 is again operated so as to place the substrate P back on the conveyor 43 for movement to registry with the operating section 62. At this time, the substrate P will be positioned in the Y-Y axis and the mounter heads 47, which can include a number of mounters will be operated to deposit components from the feeders 51 and/or 52 thereon. At the time this operation is being completed, a new substrate P may be operated at the operating section 61. Thus, it should be readily apparent that simultaneous mounting can be carried on at the station 61 and 62 and since the feeder sections 48, 49, 51 and 52 are positioned closely adjacent the sides of the conveyor 43 the distance for movement necessary to appropriately position the various components can be substantially reduced so as to permit high speed operation. The system may also use a pictorial pattern recognition for determining the components to be mounted and the locations of their mounting. Of course, various other ways in which the mounting operation can be accomplished may be employed in conjunction with the apparatus as thus far described.

Figure 10:
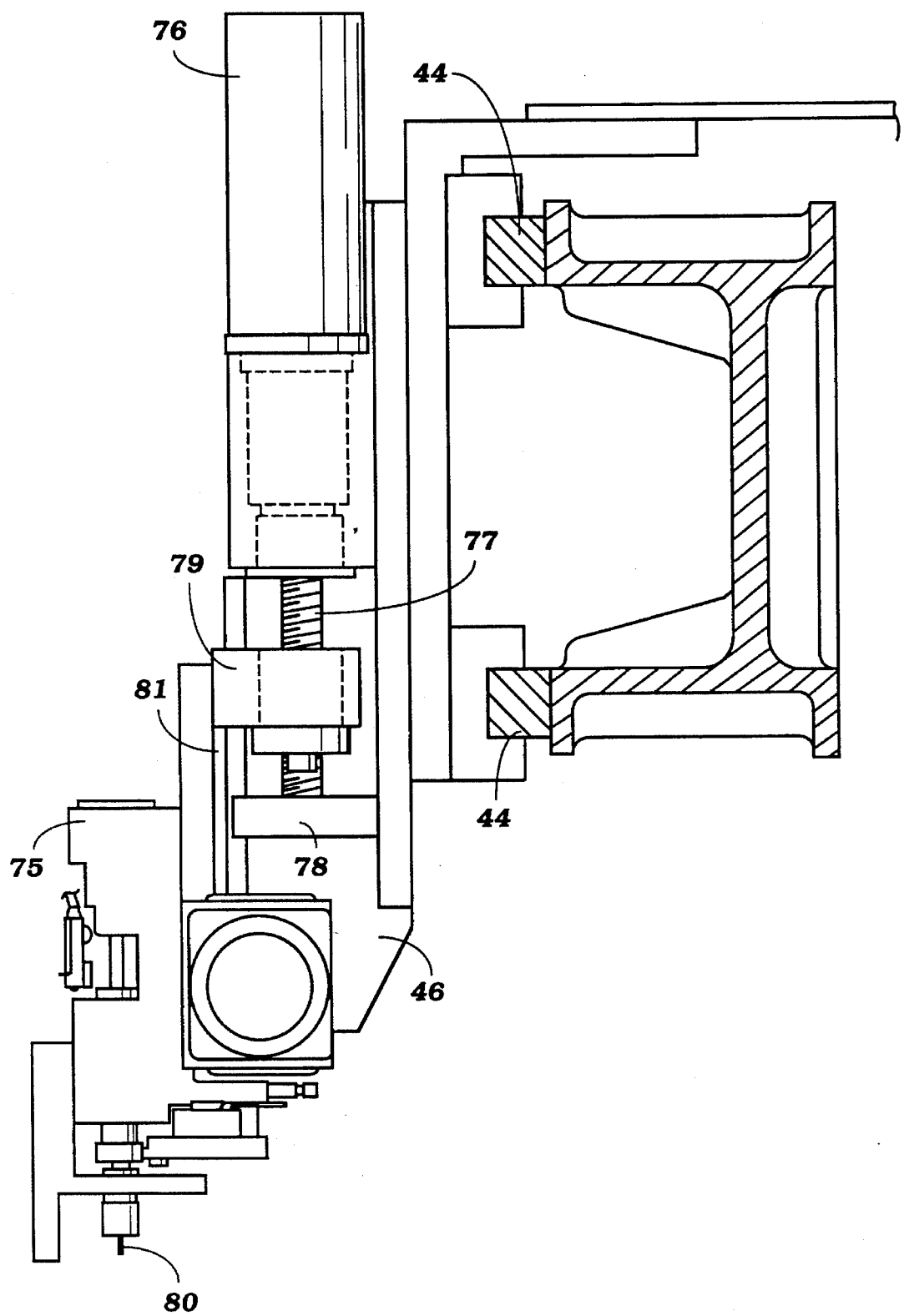
FIG. 10 is an enlarged cross sectional view showing the mounter construction.

The way in the which the individual mounter 75 are supported on the mounter heads 46 and 47 will now be described by particular reference to FIGS. 10 and 11. Each mounter 75 is mounted on the mounting head 46 in such a way as to permit adjustment of its position in the Z-Z axis. This mounting arrangement includes a servomotor 76 in the form of a reversible electric motor which drives a screw shaft 77. The screw shaft 77, which may be comprised of a ball screw, as the other screw shafts, is journaled at its lower end in a bearing 78 carried by the mounter head 46. The screw shaft 77 is engaged by a recirculating ball nut 79 that is affixed to the mounter 75 and a pair of guides 81 support the mounter 75 for movement upwardly and downwardly of upon rotation of the screw shaft 77 so as to position the mounter 75 at selected vertical heights relative to the mounter base 46. This up and down movement can be adjusted so as to provide the desired vertical positioning, as will become apparent.

Figure 11:
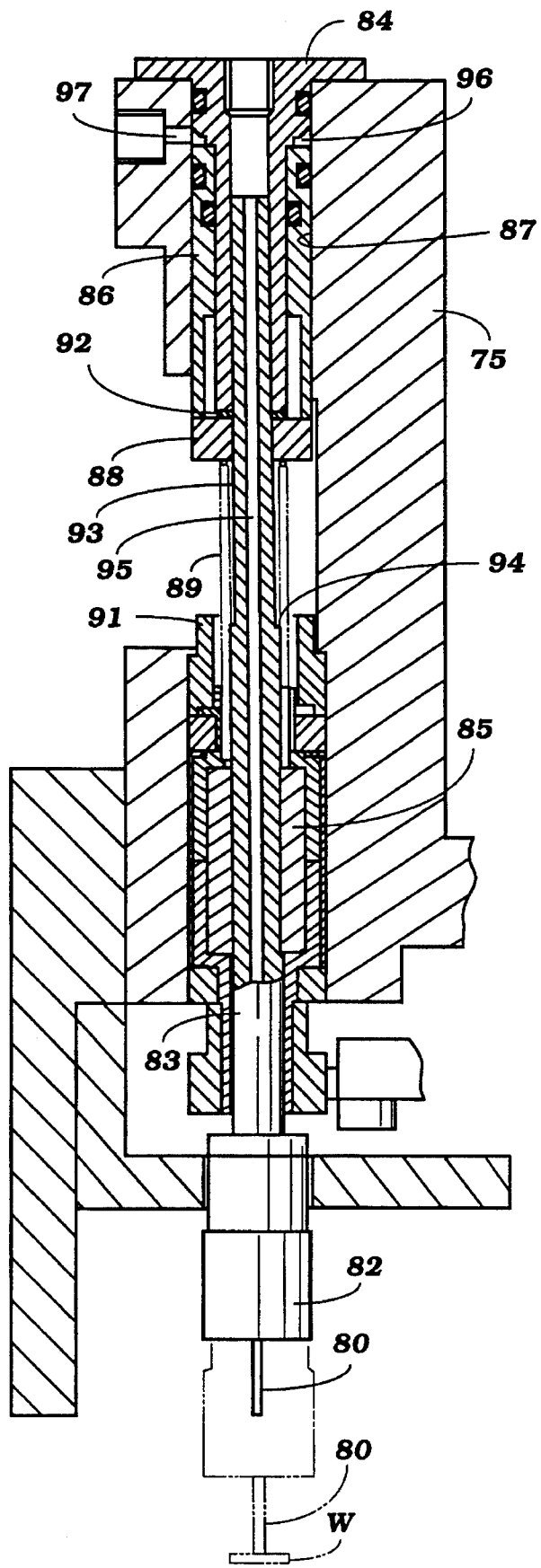
FIG. 11 is a cross sectional view of the mounter.

Referring now particularly to FIG. 11, the construction of the mounter 75 will be described more fully. The mounter 75 includes a nozzle supporting member 82 that supports a nozzle 80 that is supplied with a suitable vacuum so as to pick up the components W.

The nozzle support 82 is affixed to the lower end of a rod 83 that is supported for reciprocation within an upper guide member 84 and a lower guide member 85 which are affixed to the base of the mounter 75 in a suitable manner. An annular piston 86 is supported on the outer periphery of the upper guide member 84 and within a cylinder 87 formed by the base of the mounter 75. The piston 86 is engaged with a spring retainer 88 which is slidably supported on the rod 83. A first, heavier coil compression spring 89 is loaded between the spring retainer 88 and a stop 91 carried by the mounter base 75. The spring 89 urges the retainer member 88 upwardly into engagement with a retainer ring 92 carried by the rod 83 so as to position the rod 83 and pick-up nozzle 80 back to its retracted position as shown in solid lines in the FIG. 11.

A lighter coil compression spring 93 is interposed also between the spring retainer 88 and the rod 83. This lighter spring 93 is engaged with a shoulder 94 formed on the rod 83.

A fluid passageway 95 extends through the rod 83 and supplies vacuum to the pick-up nozzle 80 from a remote vacuum source (not shown).

A pressure chamber 96 is formed between the supporting member 84 and the upper end of the piston 86 and is adapted to receive high pressure air through a pressure conduit 97. When the chamber 96 is pressurized, the piston 86 will move downwardly and cause the spring retainer 88 to compress both the spring 89 and the spring 93. The spring 93 will transmit its load to the rod 83 to move it and the nozzle 80 to the lowered position so as to pick up a work piece W. This downward movement is limited by the contact of the spring retainer 88 with the stop 91 and the pick-up position is shown in phantom line in FIG. 11. When the pressure in the chamber 96 is released, the spring 89 will expand and the rod 83 and pick-up nozzle 80 will be returned to their upper position.

Figure 12:
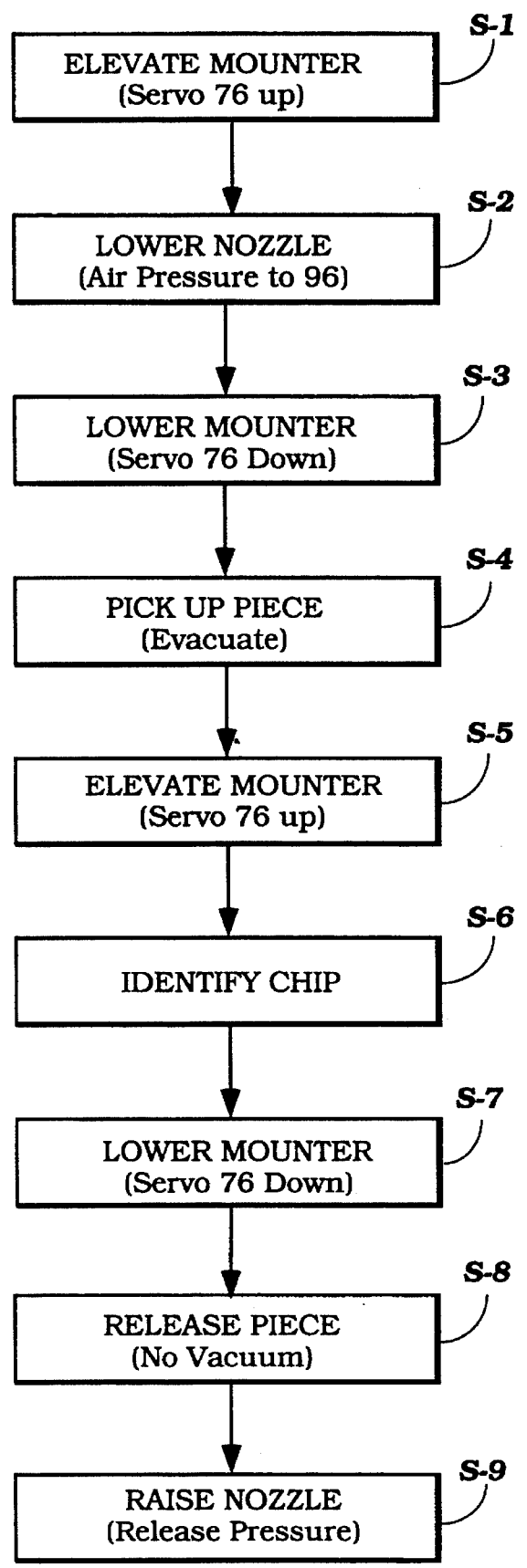
FIG. 12 is a block diagram showing one form of control routine for operating the mounter.

Conventional vacuum pick-ups have only used the construction as shown in FIG. 11 and this gives rise to difficulty in correctly positioning the work pieces relative to the substrate P and also the picking up of the work pieces, for the reasons as aforenoted. However, by use of the servomotor 76 height adjustments and speed adjustments for movement can be made and one manner in which this can be done will be described in conjunction with the block diagram of FIG. 12.

Figure 1:
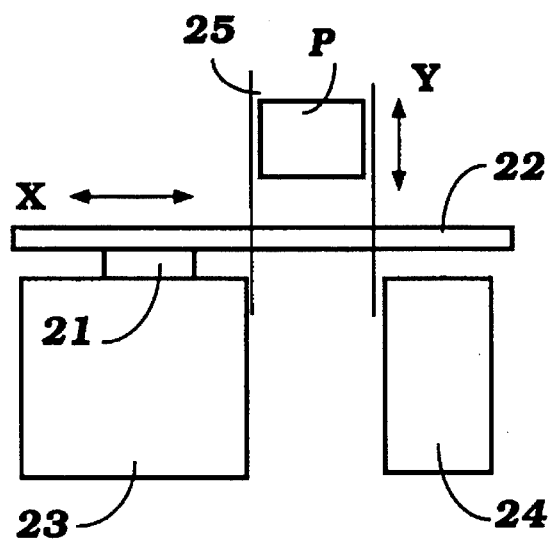
FIG. 1 is partially schematic top plan view of a prior art type of surface mounter.
Figure 2:
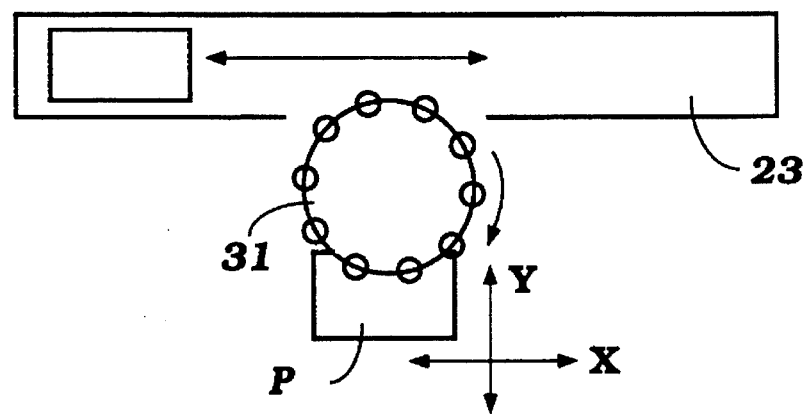
FIG. 2 is partially schematic top plan view of another type of prior art surface mounter.

At the first step S-1 the pick-up nozzle 80 is in its retracted position as shown in the solid line view of FIG. 1 and the servomotor 76 is energized to rotate the screw 77 in a direction to raise the mounter head 75. Once the mounter head 75 is fully elevated, the program moves to the step S-2 so as to pressurize the chamber 96 and move the pick-up nozzle 80 and its support 82 downwardly to the end of its stroke to the position shown in phantom line in FIG. 11. Once the pick-up nozzle 80 is fully lowered, the servomotor 76 is energized at the step S-3 to drive it downwardly sufficient to be in a position so as to be positioned just immediately above the component chip W on the respective feeder 48, 49, 51 or 52. Once the servomotor is fully lowered, then the vacuum pick-up is evacuated by applying vacuum through the conduit 95 at the step S-4 so as to attract the component W.

Once the chip W is picked up, the program moves to the step S-5 so as to energize the servomotor 76 to again elevate the mounter assembly 75 to a predetermined position. In this predetermined position the component chip W is identified through a pictorial pattern recognition in a well known manner. This is indicated by the step S-6.

The distance between the selected chip W and the substrate on the respective operating section 61 or 62 will be predetermined by this recognition and then the servomotor 76 is energized to again lower the mounter 75 the necessary distance so as to place the chip W in registry with the desired position on the substrate P. Then at the step S-8, the chip is released by discontinuing the source of vacuum to the vacuum nozzle 80 by cutting off the vacuum supply to the passage 95. Once the part is released, the pressure to the chamber 96 is released so as to cause the pick-up nozzle 80 to be elevated and the program is again ready to repeat to the step S-1 to elevate the mounter.

As may be readily seen by this procedure it is possible to cause relatively rapid up and down movement of the entire mounter assembly 75 or to stage this movement so that it occurs rapidly except at the end of its movement. In addition, the stroke or distance can be varied to suit the size and type of the components without having any shock in mounting.

Figure 13:
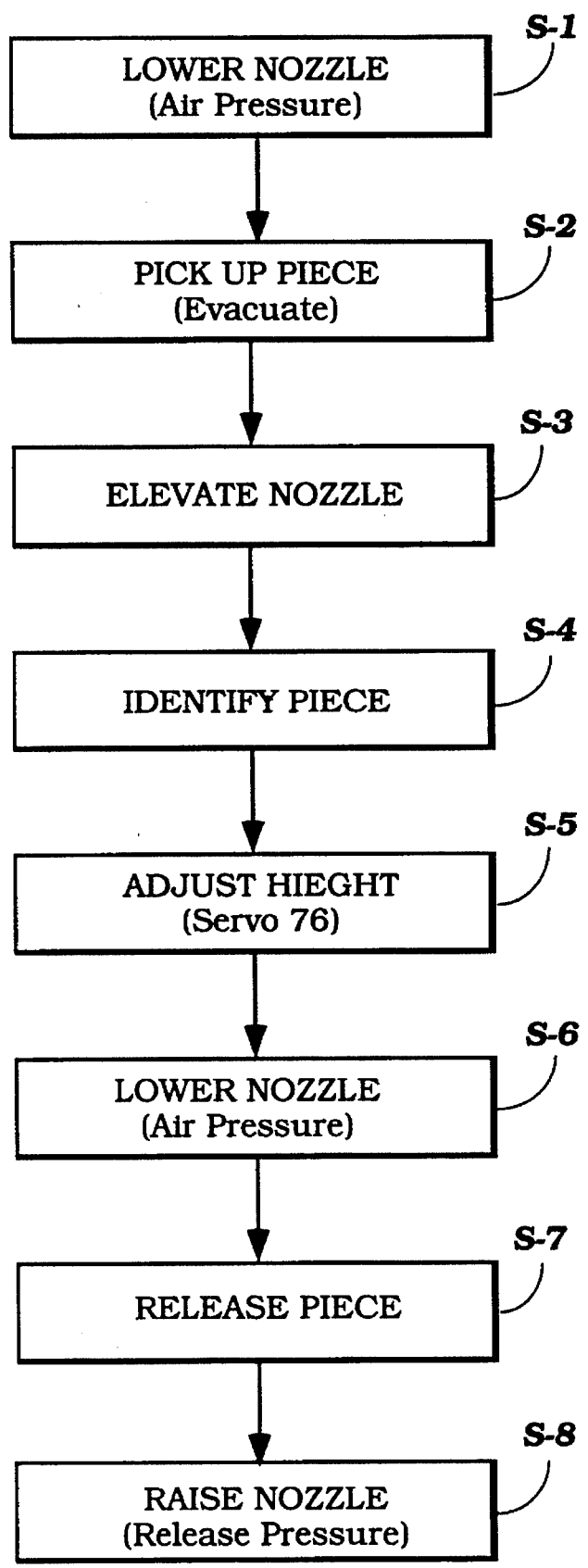
FIG. 13 is a block diagram showing another control routine for the surface mounter.

Another possible control routine for picking up and releasing the chips W is shown in FIG. 13. Referring to this figure, at the first step S-1, the pick-up nozzle 80 which has been held in its retracted position at a desired height, as will become apparent, is actuated so as to lower it to pick up the work piece W from the respective feeder section 48, 49, 51 or 52. At the step S-2, the vacuum force is exerted through the rod bore 95 and the work piece W will be attracted to the pick-up nozzle 80. At the step S-3, the pick-up nozzle 83 is then elevated through release of the air pressure in the chamber 96 and through the action of the return spring 89. The work piece W is then identified through a pictorial pattern recognition (step S-4).

The height of the mounter head 75 is then adjusted to correspond to the attracted work piece in accordance with a predetermined pattern by actuation of the servomotor 76 at the step S-5. The mounter nozzle 83 is then again lowered by pressurizing of the chamber 96 so as to bring the work piece into registry with the substrate P at the appropriate height at the step S-6. Then at the step S-7, the work piece W is released by releasing the vacuum in the passage 95. The nozzle 83 is then elevated at the step S-8 by releasing the pressure in the chamber 96 and permitting the return spring 89 to again elevate the nozzle 80. This method obviously requires less movement than the method of FIG. 12 and thus permits higher speed operation.

It should be readily apparent from the foregoing description that the preferred embodiments of the invention are extremely effective in permitting rapid positioning of work pieces from a variety of sources on a substrate and because of the multiple stations and small travel required, this can be done at high speed and high efficiency. Also, the mounter construction is operated so as to be able to compensate for differences in height and thickness of the various components without damage. Of course, the foregoing description is that of preferred embodiments of the invention and various changes and modifications may be made without departing from the spirit and scope of the invention, as defined by the appended claims.

We claim:

1. A device for mounting components on a substrate, said device comprising a conveyor line for conveying substrates, a mounter mounted on first guide rail means for movement relative to said conveyor line along a first axis between a first position for picking up components and a second portion for depositing components, said mounter including gripping means for gripping and releasing components, an operating section supported on second guide rail means for movement relative to said mounter and to said conveyor line along a second axis disposed at an angle to said first axis, means for transferring a substrate from said conveyor line to said operating section, and, means for moving said operating section along said second axis to position said substrate relative to said mounter for mounting of a component on said substrate.

2. A device for mounting components on a substrate as set forth in claim 1 wherein the first axis is disposed along one side of the conveyor line and extends parallel to it and the second axis is perpendicular to the first axis.

3. A device for mounting components on a substrate as set forth in claim 2 wherein said first and second guide rail means are separate from each other and at least one of said first and second guide rail means comprising a pair of spaced apart guide rails.

4. A device for mounting components on a substrate as set forth in claim 3 wherein both of the first and second guide rail means each comprising a pair of spaced apart guide rails and wherein the guide rails mounting the operating section extend outwardly of the guide rails mounting the mounter relative to the conveyor.

5. A device for mounting components on a substrate as set forth in claim 4 wherein the mounter is also movable vertically relative to the operating section.

6. A device for mounting components on a substrate as set forth in claim 5 wherein the mounter is driven for its vertical movement by a servomotor.

7. A device for mounting components on a substrate as set forth in claim 6 wherein the mounter further includes pneumatic means for moving the gripping means in a vertical direction between first and second vertical positions spaced a fixed distance apart, said servomotor being operative to relocate said vertical positions upon its operation.

8. A device for mounting components on a substrate as set forth in claim 2 wherein there are mounters and operating sections mounted in pairs at spaced locations along the conveyor.

9. A device for mounting components on a substrate as set forth in claim 8 wherein the one mounter and operating section is disposed on one side of the conveyor line and another mounter and operating section is disposed on the other side of the conveyor line.

10. A device for mounting components on a substrate as set forth in claim 9 wherein there are a plurality of gripping means for gripping and releasing the components carried by each mounter.

11. A device for mounting components on a substrate as set forth in claim 2 wherein the one mounter and operating section is disposed on one side of the conveyor line and another mounter and operating section is disposed on the other side of the conveyor line.

12. A device for mounting components on a substrate as set forth in claim 11 wherein there are a plurality of gripping means for gripping and releasing the components carried by each mounter.

13. A device for mounting components on a substrate as set forth in claim 12 further including a plurality of feed section disposed on opposite sides of the conveyor line for feeding components to the mounters.

14. A device for mounting components on a substrate as set forth in claim 11 wherein said first and second guide rail means are separate from each other and at least one of said first and second guide rail means comprising a pair of spaced apart guide rails.

15. A device for mounting components on a substrate as set forth in claim 14 wherein both of the first and second guide rail means each comprising a pair of spaced apart guide rails and wherein the guide rails mount the operating section extend outwardly of the guide rails mounting the mounter relative the conveyor.

16. A device for mounting components on a substrate as set forth in claim 15 wherein the one mounter and operating section is disposed on one side of the conveyor line and another mounter and operating section is disposed on the other side of the conveyor line.

17. A device for mounting components on a substrate as set forth in claim 1 wherein there are at least a pair of feed sections disposed at spaced locations along the first axis on opposite sides of the second position of the mounter for supplying components to said mounter on the opposite sides of said second position.

18. A mounter for selectively gripping and releasing work pieces comprising a base, a gripper mounted on said base, said gripper carrying gripping means therein for selectively gripping and releasing work pieces, said gripping means being supported for movement relative to said gripper, means for mounting said gripper and said gripping means for movement as a unit relative to said base, a servomotor connected to said gripper and said gripping means for positioning said gripper and said gripping means in selective positions as a unit relative to said base, and a motor having a fixed stroke connected to said gripping means for moving said gripping means between first and second positions relative to said gripper.

19. A mounter as set forth in claim 18 wherein the motor comprises a pneumatic motor.

* * * * *